United States Patent
Hosono et al.

(10) Patent No.: US 8,531,865 B2
(45) Date of Patent: Sep. 10, 2013

(54) SEMICONDUCTOR MEMORY DEVICE

(75) Inventors: Koji Hosono, Fujisawa (JP); Satoru Takase, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 13/197,950

(22) Filed: Aug. 4, 2011

(65) Prior Publication Data

US 2012/0033480 A1  Feb. 9, 2012

(30) Foreign Application Priority Data

Aug. 6, 2010  (JP) ................. 2010-177806

(51) Int. Cl.
*G11C 11/00* (2006.01)
(52) U.S. Cl.
USPC .......................................... 365/148; 365/158
(58) Field of Classification Search
USPC .................................................. 365/148, 158
See application file for complete search history.

(56) References Cited

U.S. PATENT DOCUMENTS

| | | | |
|---|---|---|---|
| 7,697,317 B2 | 4/2010 | Shimaoka et al. | |
| 7,978,499 B2 | 7/2011 | Hosono et al. | |
| 2006/0198183 A1* | 9/2006 | Kawahara et al. | 365/163 |
| 2008/0056023 A1* | 3/2008 | Lee et al. | 365/189.011 |
| 2009/0147563 A1* | 6/2009 | Happ et al. | 365/163 |
| 2010/0073983 A1* | 3/2010 | Hosoi | 365/51 |

* cited by examiner

*Primary Examiner* — Michael Tran
(74) *Attorney, Agent, or Firm* — Oblon, Spivak, McClelland, Maier & Neustadt, L.L.P.

(57) ABSTRACT

A semiconductor memory device according to the embodiment comprises a memory cell array including first line, second line crossing the first line, and memory cell containing variable resistance element provided on the intersection of the first and second lines; a data write unit operative to cause the variable resistance element to make a transition from a first resistance to a second resistance different from the first resistance; and a resistance state detection unit including an abnormality detection circuit operative to detect a transition of the resistance of the variable resistance element to a third resistance when the data write unit causes the variable resistance element to make the transition from the first resistance to the second resistance (where the third resistance<the first resistance<the second resistance, or the third resistance>the first resistance>the second resistance).

18 Claims, 10 Drawing Sheets

SEMICONDUCTOR MEMORY DEVICE

CROSS-REFERENCE TO RELATED APPLICATION

This application is based upon and claims the benefit of priority from the prior Japanese Patent Application No. 2010-177806, filed on Aug. 6, 2010, the entire contents of which are incorporated herein by reference.

FIELD

The embodiment relates to a semiconductor memory device.

BACKGROUND

Previously, as the electrically erasable programmable nonvolatile memory, a flash memory has been well-known, which comprises a memory cell array of NAND-type or NOR-type memory cells each having a floating gate structure. In addition, as the nonvolatile and fast random access memory, a ferroelectric memory has also been known.

On the other hand, as the technologies for much finer fabrication of memory cells, variable resistance memories have been proposed, which use variable resistance elements in memory cells. Known examples of such the variable resistance elements include a phase-change memory element that can change the resistance in accordance with the state change due to the crystalline/amorphous phase of a chalcogenide compound; an MRAM element that uses the resistance variation due to the tunnel magneto-resistance effect; a polymer ferroelectric RAM (PFRAM) memory element of which resistance element is formed of a conductive polymer; and a ReRAM element that can cause a resistance variation in accordance with the supply of an electric pulse.

In the case of, for example, a memory cell that uses the ReRAM element, however, no resistance variation may be caused only when the electric pulse is simply supplied due to the instability of the memory cell. In addition, a resistance variation in a direction opposite to the intended one may be caused. If such the resistance variation in the opposite direction is left, bad influences are concerned, including the shortened life of the memory cell.

DETAILED DESCRIPTION

A semiconductor memory device according to the embodiment comprises a memory cell array including a first line, a second line crossing the first line, and a memory cell containing a variable resistance element provided on the intersection of the first and second lines; a data write unit operative to cause the variable resistance element to make a transition from a first resistance to a second resistance different from the first resistance; and a resistance state detection unit including an abnormality detection circuit operative to detect a transition of the resistance of the variable resistance element to a third resistance when the data write unit causes the variable resistance element to make the transition from the first resistance to the second resistance (where the third resistance<the first resistance<the second resistance, or the third resistance>the first resistance>the second resistance).

With reference to the drawings, semiconductor memory devices according to the embodiments will now be described below.

First Embodiment

Configuration of Semiconductor Memory Device

The first description is given to a memory cell array in a semiconductor memory device according to a first embodiment.

Figure 1:
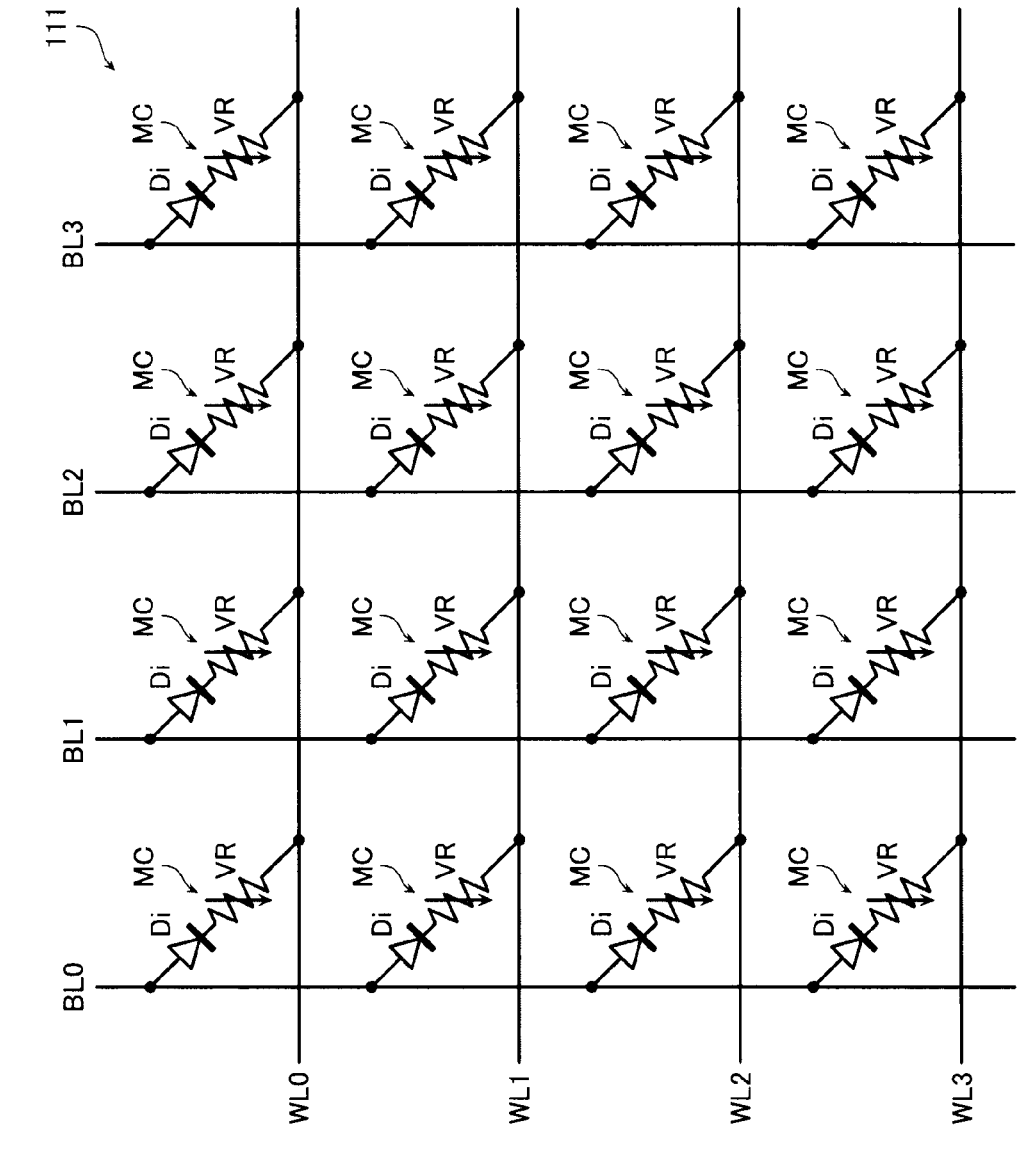
FIG. 1 is a diagram showing a memory cell array in a semiconductor memory device according to a first embodiment.

FIG. 1 is a diagram showing a part of a memory cell array 111. The memory cell array 111 comprises memory cells MC including variable resistance elements VR at intersections of mutually crossing word lines WL (first lines) and bit lines BL (second lines) as shown in FIG. 1. In addition to the variable resistance element VR, the memory cell MC also includes a rectifier element, such as a diode D1, serially connected to the variable resistance element VR. It is assumed herein that the bit line BL is connected to the anode side of the diode D1 and the word line WL to the cathode side. The arrangement and polarity of the diode D1 and the variable resistance element VR contained in the memory cell MC are not limited to the shown example.

The variable resistance element VR has an electrode/transition-metal-oxide/electrode structure, for example, and causes resistance variations of the metal oxide in accordance with the condition of application of voltage, current, heat and so forth to store different states of the resistance as information. Available examples of the variable resistance element VR specifically include one that can vary the resistance in accordance with the phase change between the crystalline state and the amorphous state, for example, a chalcogenide (PCRAM); one that can vary the resistance by precipitating metal cations to form a bridge (Conducting Bridge) between electrodes and ionizing the precipitated metal to break the bridge (CBRAM); and one that can vary the resistance by applying voltage or current (ReRAM).

The next description is given to data write/erase to the memory cell MC and data read from the memory cell MC.

Data write to the memory cell MC can be executed by supplying the variable resistance element VR with a voltage of, for example, 3.5 V (actually around 4.5 V containing the voltage drop at the diode D1) and a current of around 10 nA for a time of around 10-100 ns. Thus, the variable resistance element VR varies from a high resistance state (a state in which it has a first resistance in the case of data write) to a low resistance state (a state in which it has a second resistance in the case of data write).

On the other hand, data erase to the memory cell MC can be executed by supplying the variable resistance element VR in the low resistance state, after setting, with a voltage of, for example, 0.8 V (actually around 1.8 V containing the voltage drop at the diode D1) and a current of around 1-10 μA for a time of around 500 ns to 2 μs. Thus, the variable resistance element VR varies from the low resistance state (a state in which it has the first resistance in the case of data erase) to the high resistance state (a state in which it has the second resistance in the case of data erase).

Hereinafter, the operation of the variable resistance element VR to make a transition from the high resistance state to the low resistance state may also be referred to as "setting"; the operation of the variable resistance element VR to make a transition from the low resistance state to the high resistance state as "resetting"; a state of the memory cell MC with the variable resistance element VR in the high resistance state as the "reset state"; a state of the memory cell MC with the variable resistance element VR in the low resistance state as the "set state"; the direction of an increasing resistance state of the variable resistance element VR as "reset-ward"; and the direction of a lowering resistance state of the variable resistance element VR as "set-ward".

Reading from the memory cell MC can be executed by supplying the variable resistance element VR with a voltage of, for example, 0.4 V (actually around 1.4 V containing the voltage drop at the diode D1) and monitoring the current flowing through the variable resistance element VR at a sense amp, thereby deciding whether the variable resistance element VR is in the low resistance state or in the high resistance state.

The following description is given to the entire configuration of the semiconductor memory device according to the present embodiment including the memory cell array 111.

Figure 2:
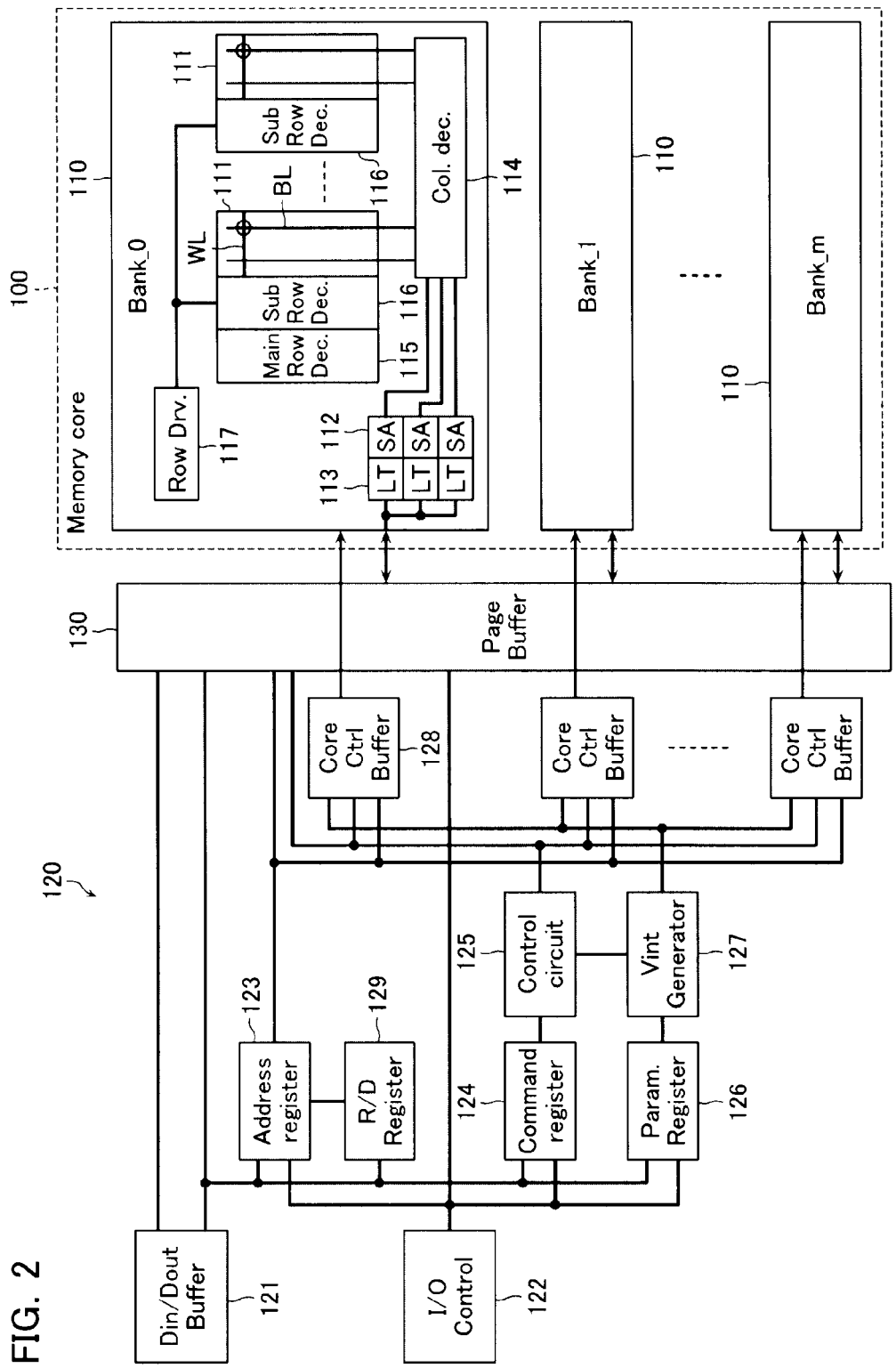
FIG. 2 is a block diagram showing the semiconductor memory device according to the present embodiment.

FIG. 2 is a block diagram showing the semiconductor memory device according to the present embodiment.

The semiconductor memory device comprises a memory core unit 100, and a peripheral circuit 120 operative to control data read/write over the memory core unit 100.

The memory core unit 100 comprises a plurality of banks 110 (Bank_0 to Bank_m). Each bank 110 includes a plurality of memory cell arrays 111. In each bank 110, a column decoder 114 is provided for the memory cell arrays 111 in common to select among the bit lines BL. The column decoder 114 selectively connects the bit lines BL to sense amps 112 each containing a resistance state detection unit and to latches 113. The sense amps 112 detect read data and the latches 113 temporally hold read data and write data. The sense amps 112 and latches 113 are also shared among the memory cell arrays 111. The column decoder 114 includes a plurality of column circuit units, containing a decoder circuit and a bit line switch circuit, operative to simultaneously select 16 bit lines, for example. The following description is given on the assumption that the number of the sense amps 112 is equal to 16 corresponding to the number of the bit lines BL simultaneously selected by the column decoder 114.

The latches 113 are connected to a page buffer 130 in the peripheral circuit 120 and used to temporally hold read data or write data communicated between the sense amps 112 and the page buffer 130 at the time of reading or writing. The page buffer 130 is a data register capable of temporally holding 1 page of data (for example, 2 K bytes), that is, a unit of data processing. If the page buffer 130 is configured to hold plural pages of data, the page buffer 130 may be used to serve as a cache memory.

In each bank 110, a word line WL is selected via a main row decoder 115 provided in common and sub row decoders 116 provided separately for the memory cell arrays 111, and the above selected word line WL is driven by a row driver 117 provided in common. Namely, the row decoder has a hierarchy including the main row decoder 115 shared among the memory cell arrays 111 and the sub row decoders 116 separately accompanying the memory cell arrays 111. The selected word line WL is supplied with a certain selected-word line voltage from the word line driver circuit 117, and unselected word lines WL with a certain unselected word line voltage as well.

The peripheral circuit 120 includes a data input/output buffer 121, an input/output control circuit 122, an address register 123, a command register 124, an operation control circuit 125, a parameter register 126, an internal voltage generator circuit 127, core control buffers 128, a redundancy address register 129, and the page buffer 130.

The data input/output buffer 121 is connected to an I/O pad to input data to and output data from the semiconductor memory device. FIG. 2 shows a multiplex system, in which a command, an address and data for use in operation of the semiconductor memory device are all given from the I/O pad. For example, in the case of data write, a data write command, an address indicative of the location of the selected memory cell MC, and write data are given to the semiconductor memory device via the data input/output buffer 121. In the case of data read, a data read command and a selection address are given to the semiconductor memory device. After read data is stored in the page buffer 130 from the memory core unit 100 based on these command and address, the data is output to external via the data input/output buffer 121.

The input/output control circuit 122 controls identification of data and so forth that are input/output via the I/O pad, and data output. The input/output control circuit 122 is supplied with various control signals from external, such as a write enable signal, a read enable signal, a command latch enable signal, and an address latch enable signal. The input/output control circuit 122 controls the input/output data based on the combinations of states of these signals and the stipulations of timing.

The input/output control circuit 122 identifies data input from the data input/output buffer 121 as a command at the time of command input and stores it in the command register 124. Similarly, the input/output control circuit 122 identifies input data as an address at the time of address input and stores it in the address register 123. The input/output control circuit 122 stores input data in the page buffer 130 at the time of data input and allows the page buffer 130 to output data conversely at the time of data output.

In addition, the data input/output lines are connected to the redundancy address register 129 operative to store a redundancy/replacement address required for control of access to a column redundancy cell and a row redundancy cell and the parameter register operative to store various voltage setting parameters and so forth, and thus configured to input/output such data as necessary.

Although not shown in the figure, the input/output control circuit 122 may be configured to manage the output control of the status indicative of the operation state of the semiconductor memory device, ID code output and so forth.

At the time of reading, a command is input to activate the internal control clock and allow the operation control circuit 125 to start the operation. In addition, it also activates the internal voltage generator circuit 127 operative to generate internal voltages corresponding to various operations. At the time of reading, the operation control circuit 125 supplies the core control buffers 128 with timing signals to control charge/discharge of the word lines WL and bit lines BL and precharge and sensing at the sense amps 112 so that the memory core unit 100 can execute desired reading. In addition, the internal voltage generator circuit 127 also supplies the memory core unit 100 and the core control buffers 128 with certain voltages.

The core control buffers 128 are provided separately for the banks 100 and accordingly the banks 110 to be operated simultaneously can be controlled freely. For example, if it is intended to increase the data processing speed of reading or writing, the number of banks to be activated simultaneously should be increased. On the other hand, if it is intended to suppress current consumption, the number of banks to be activated simultaneously may be decreased.

<Sense Amp>

The sense amp 112 will be detailed next.

Figure 3:
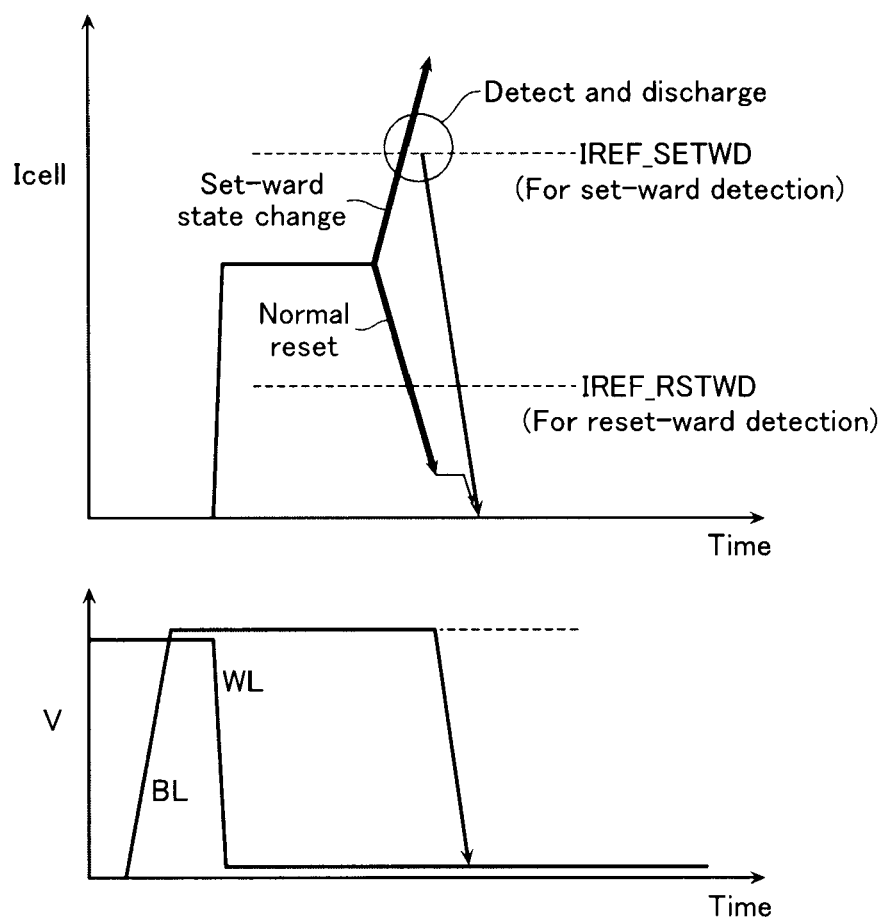
FIG. 3 is an operating waveform diagram at the time of resetting in the semiconductor memory device according to the present embodiment.

As described above, resetting (erasing) can be realized by supplying the variable resistance element VR of the memory cell MC with a reset pulse of the voltage of 0.8 V and the current of around 1-10 μA for around 500 ns to 2 μs, for example. In practice, however, an instability factor of the memory cell MC may cause the resistance state of the variable resistance element VR to make a set-ward transition as shown in FIG. 3. Resetting should cause the cell current ICELL flowing in the memory cell MC to originally decrease and become lower than a reference current IREF_RSTWD. Among the memory cells MC, though, such a memory cell MC may arise that has a cell current ICELL increased by resetting on the contrary. When such the abnormal operation is left, the memory cell MC may be damaged to shorten the life of the memory cell MC.

Therefore, the semiconductor memory device according to the present embodiment comprises a set-ward detection circuit (abnormality detection circuit) in the sense amp 112 to detect such the abnormal operation at the time of resetting. The set-ward detection circuit is a circuit that detects an abnormality when the cell current ICELL exceeds a reference current IREF_SETWD (first reference current) in FIG. 3 because it is abnormal.

Figure 4:
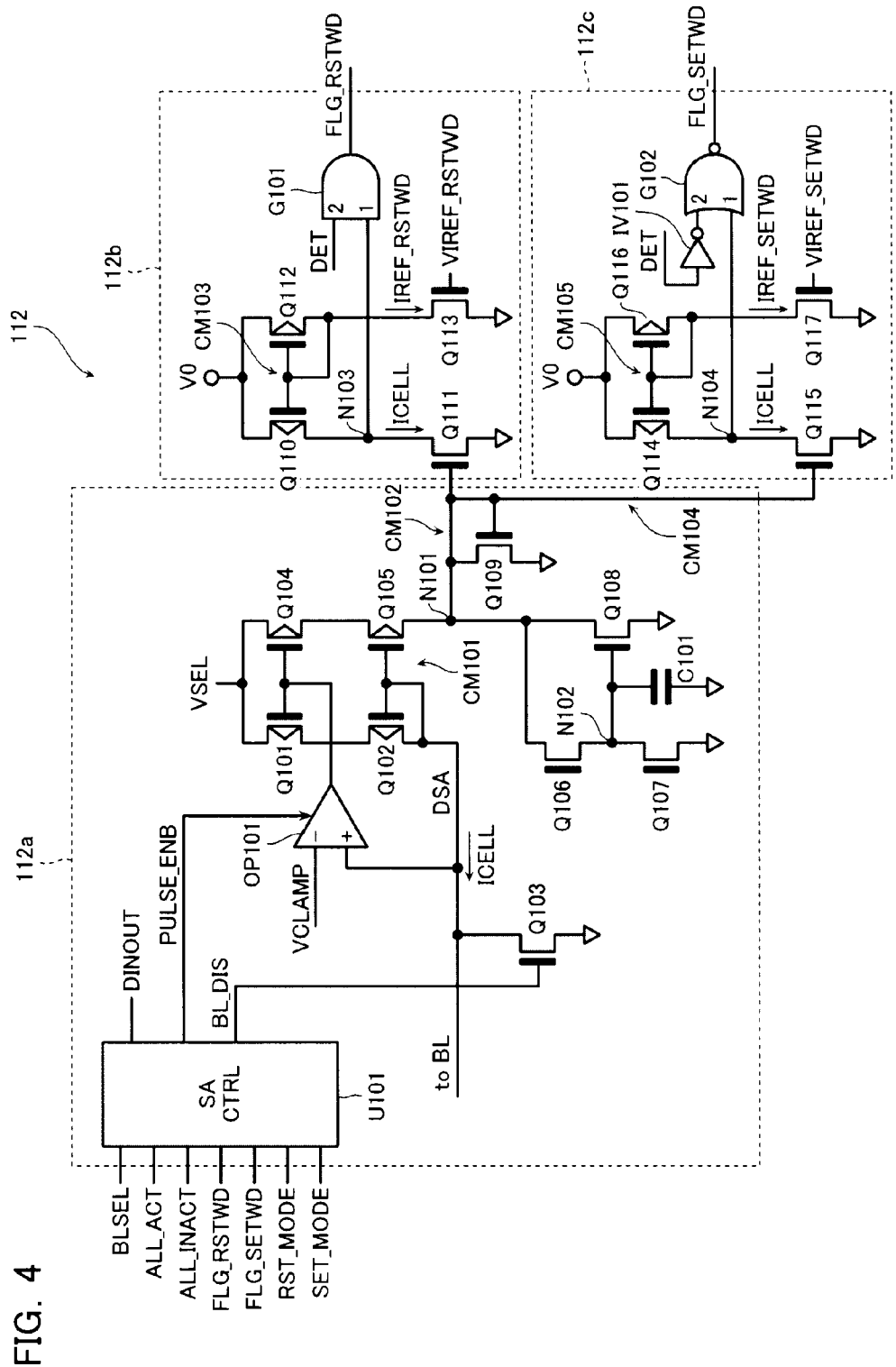
FIG. 4 is a circuit diagram showing a part of a sense amp in the semiconductor memory device according to the present embodiment.

FIG. 4 is a circuit diagram showing a part of the sense amp 112.

In addition to the set-ward detection circuit 112c, the sense amp 112 also includes a bit-line selection voltage supply circuit 112a and a reset-ward detection circuit 112b. The bit-line selection voltage supply circuit 112a is a circuit contained in a data write unit. The reset-ward detection circuit 112b and the set-ward detection circuit 112c are circuits contained in the resistance state detection unit.

The bit-line selection voltage supply circuit 112a is a circuit that supplies the selected bit line BL with a bit-line selection voltage VBL_SEL required for resetting.

The bit-line selection voltage supply circuit 112a includes transistors Q101, Q102 serially connected between a node DSA and a VSEL terminal supplied with a voltage for applying a sufficient voltage to the bit line BL at the time of setting or resetting, and transistors Q104, Q105 serially connected between the VSEL terminal and a node N101.

The transistors Q101, Q104 have respective gates, which are connected to the output terminal of an operational amplifier OP101. The operational amplifier OP101 controls the transistors Q101 and Q104 in accordance with the difference between a clamp voltage VCLAMP and a voltage on the node DSA. Thus, the potential on the node DSA is controlled to be a potential equivalent to the clamp voltage VCLAMP. Accordingly, the bit-line selection voltage supply circuit 112a can supply the bit line BL with a desired bit-line selection voltage VBL_SEL via the column decoder 114.

The transistor Q103 is a discharging transistor for use in discharging the charge on the node DSA connected to the bit line BL.

The transistor Q103 and the operational amplifier OP101 are controlled by control signals PULSE_ENE and BL_DIS provided from a sense-amp control unit U101 described later.

The transistors Q101, Q102, Q104 and Q105 configure a current mirror circuit CM101 having the input on the side close to the transistors Q101 and Q102 and the output on the side close to the transistors Q104 and Q105. The input of the current mirror circuit CM101 is the cell current ICELL flowing in the memory cell MC. The cell current ICELL also flows in a transistor Q109 that is connected between the node N101 and the ground. The current flowing in the transistor Q109 may be adjusted to flow partly in a current adjusting transistor Q108 that is connected in parallel with the transistor Q109.

The reset-ward detection circuit 112b is a normality detection circuit, that is, a circuit operative to detect if the state of the memory cell MC makes a reset-ward transition in resetting.

The reset-ward detection circuit 112b includes serially connected transistors Q110 and Q111 between a certain voltage V0 terminal and the ground line, and serially connected transistors Q112 and Q113 as well. It also includes an AND gate G101, which has a first input connected to a node N103 located between the transistors Q110 and Q111 and a second input supplied with a control signal DET that allows detection of resetting. The output of the AND gate G101 provides a flag FLG_RSTWD indicative of the state of the memory cell MC that makes a reset-ward transition.

Together with the transistor Q109 in the bit-line selection voltage supply circuit 112a, the transistor Q111 is used to configure a current mirror circuit CM102 having the input on the side close to the transistor Q109 and the output on the side close to the transistor Q111. Thus, the cell current ICELL flows in the reset-ward detection circuit 112b via the current mirror circuit CM101.

The transistor Q113 serves as a current source of the reference current IREF_RSTWD (reference current circuit) when it receives a reference voltage VIREF_RSTWD on the gate. The reference current IREF_RSTWD is a current having a magnitude smaller than the cell current ICELL flowing in the memory cell MC in the set state and larger than the cell current ICELL flowing in the memory cell MC in the reset state, that is, a current that serves as a reference indicative of the memory cell MC in the set state normally making a reset-ward transition.

The transistors Q111 and Q112 configure a current mirror circuit CM103 having the input on the side close to the transistor Q112 and the output on the side close to the transistor Q110. The node N103 has a voltage value determined in accordance with the magnitude relationship between the reference current IREF_RSTWD and the cell current ICELL. Thus, the first input to the AND gate G101 (current comparator circuit) becomes "H" on condition that IREF_RSTWD>ICELL. This means that the cell current ICELL becomes lower than that in the set state, and means that the state of the memory cell MC normally makes a reset-ward transition. At this time, the flag FLG_RSTWD becomes "H" on condition that the control signal DET is at "H".

The set-ward detection circuit 112c is a circuit operative to detect if the state of the memory cell MC makes a set-ward transition in resetting.

The set-ward detection circuit 112 includes serially connected transistors Q114 and Q115 between a certain voltage V0 terminal and the ground line, and serially connected transistors Q116 and Q117 as well. It also includes a NOR gate G102 (current comparator circuit), which has a first input connected to a node N104 located between the transistors Q114 and Q115 and a second input supplied with the control signal DET via an inverter IV101. The output of the NOR gate G102 provides a flag FLG_SETWD indicative of the state of the memory cell MC that makes a set-ward transition.

Together with the transistor Q109 in the bit-line selection voltage supply circuit 112a, the transistor Q115 is used to configure a current mirror circuit CM104 having the input on the side close to the transistor Q109 and the output on the side close to the transistor Q115. Thus, the cell current ICELL flows in the set-ward detection circuit 112c via the current mirror circuit CM101.

The transistor Q117 serves as a current source of the reference current IREF_SETWD when it receives the reference voltage VIREF_SETWD on the gate. The reference current IREF_SETWD is a current having a magnitude substantially equal to the cell current ICELL flowing when the memory cell MC has a lower resistance (third resistance) than that in the set state, that is, a current that serves as a reference indicative of the memory cell MC in the set state normally making a set-ward transition.

The transistors Q114 and Q116 configure a current mirror circuit CM105 having the input on the side close to the transistor Q116 and the output on the side close to the transistor Q114. A node N104 has a voltage value determined in accordance with the magnitude relationship between the reference current IREF_SETWD and the cell current ICELL. Thus, the first input to the NOR gate G102 becomes "L" on condition that IREF_SETWD<ICELL. This means that the cell current ICELL becomes higher than that in the set state, and means that the state of the memory cell MC makes a set-ward transition. At this time, the flag FLG_SETWD becomes "H" on condition that the control signal DET is at "H".

Figure 5:
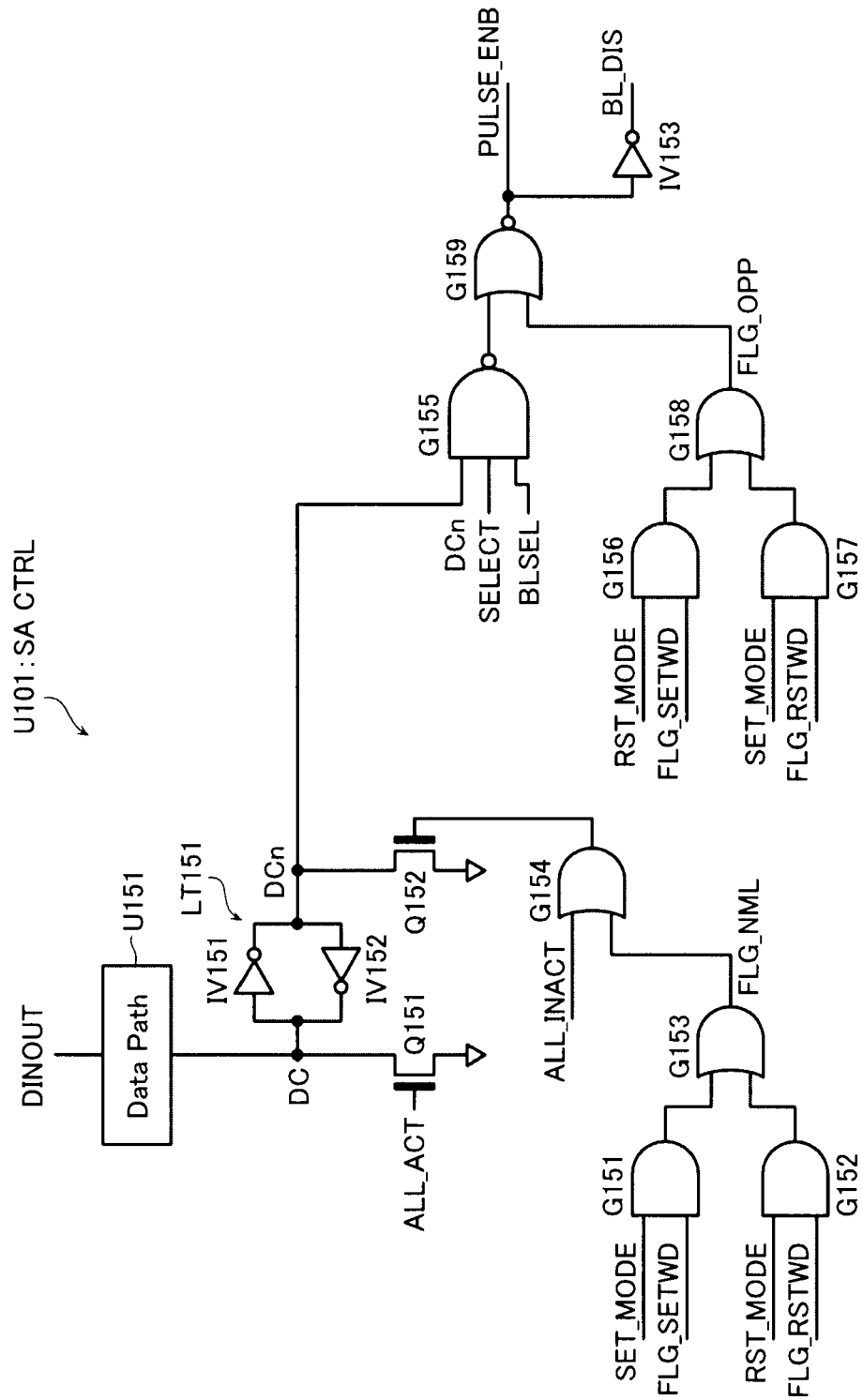
FIG. 5 is a circuit diagram showing a sense-amp control circuit in the semiconductor memory device according to the present embodiment.

The circuitry of the sense amp control unit U101 is described next with reference to FIG. 5.

The sense amp control unit U101 includes a latch LT151 composed of inverters IV151, IV152 having cross-connected inputs and outputs. A node DC on the input side of the inverter IV151 holds data input from a data input/output DINOUT via a data path U151. A node DCn on the input side of the inverter IV152 holds data logically opposite to the data held on the node DC.

The node DC is connected to the ground line via a transistor Q151. The transistor Q151 is controlled by a control signal ALL_ACT. When the control signal ALL_ACT becomes "H", the node DC becomes "L" independent of input data. On the other hand, the node DCn is connected to the ground line via a transistor Q152.

The sense amp control unit U101 also includes an AND gate G151 that receives a control signal SET_MODE and the flag FLG_SETWD; an AND gate G152 that receives a control signal RST_MODE and the flag FLG_RSTWD; an OR gate G153 that receives the output from the AND gate G151 and the output from the AND gate G152; and an OR gate G154 that receives a control signal ALL_INACT and a flag FLG_NML, that is, the output from the OR gate G153. The transistor G152 is controlled by the output from the OR gate G154.

The sense amp control unit U101 further includes a 3-input NAND gate G155 that receives the node DCn, control signals SELECT and BLSEL; an AND gate G156 that receives the control signal RST_MODE and the flag FLG_SETWD; an AND gate G157 that receives the control signal SET_MODE and the flag FLG_RSTWD; an OR gate G158 that receives the output from the AND gate G156 and the output from the AND gate G157; and a NOR gate G159 that receives the output from the NAND gate G155 and a flag FLGOPP, that is, the output from the OR gate G158. The output from the NOR gate G159 serves as a control signal PULSE_ENB, and the output from the NOR gate G159 is logically inverted to the control signal BL_DIS through an inverter IV153.

<Resetting>

The following description is given to resetting in the semiconductor memory device including the above-described sense amp 112.

Figure 6:
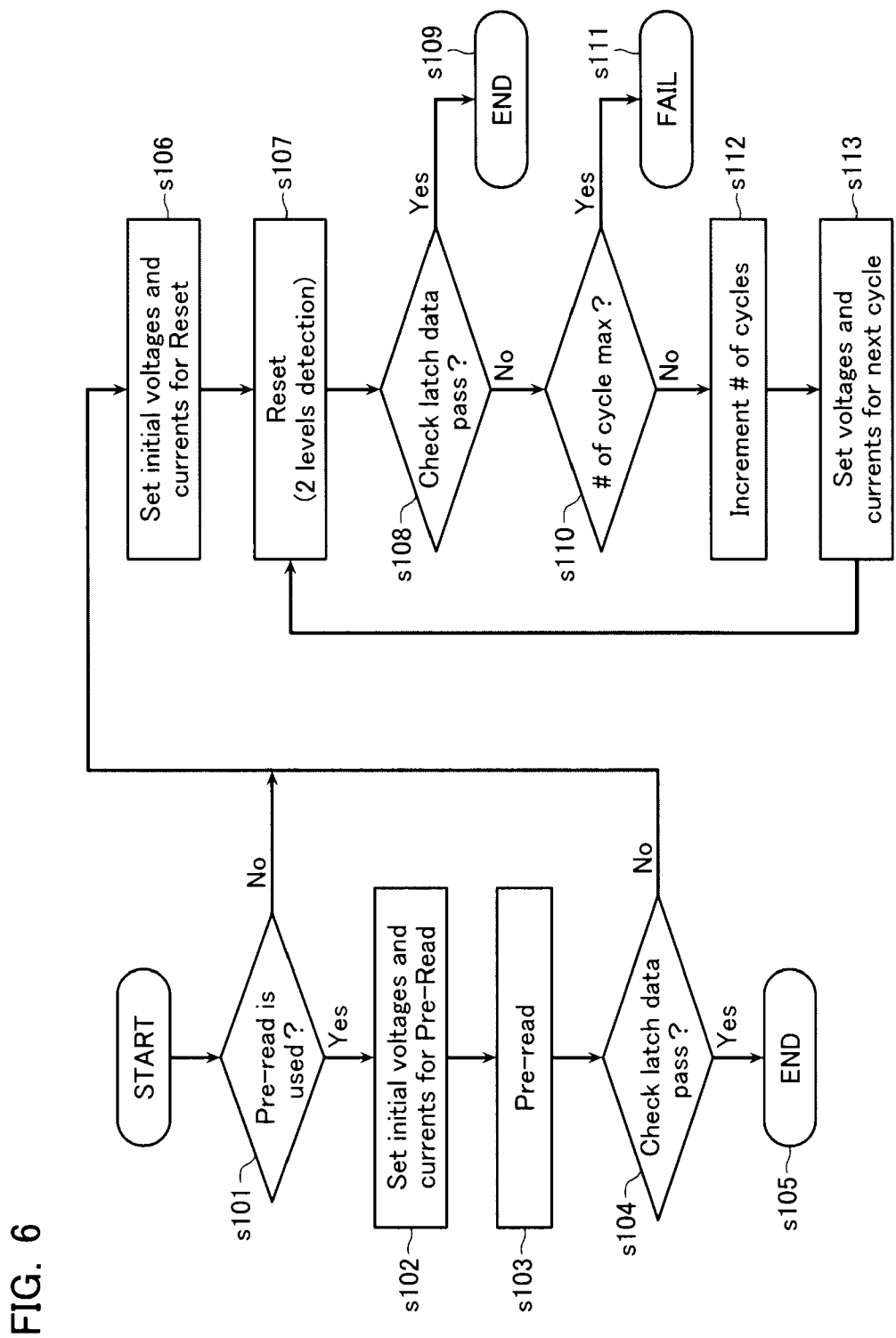
FIG. 6 is a flowchart of resetting in the semiconductor memory device according to the present embodiment.

FIG. 6 is a flowchart of resetting in the semiconductor memory device according to the present embodiment.

Before the start of resetting, pre-reading is executed to the selected memory cell MC, as necessary, to avoid disturb of the memory cell MC. The pre-reading is an operation of reading data from the selected memory cell MC to confirm the data in the memory cell MC at the present time, which is performed to extract the selected memory cell MC that requires resetting. The information on the necessity/unnecessity of execution of pre-reading may be stored in a register or the like in the chip of the semiconductor memory device.

Initially, at step s101, a decision is made if pre-reading is used based on the information in the register or the like in the chip. If pre-reading is used, the process goes to the later-described step s102. On the other hand, unless pre-reading is used, the process skips to the later-described step s106.

Subsequently, at step s102, initial values of voltage and current required for pre-reading are set.

Subsequently, at step s103, pre-reading is executed to the selected memory cell MC.

Subsequently, at step s104, the result of pre-reading at step s103 is checked. The selected memory cells MC simultaneously subjected to pre-reading or resetting and the sense amps 112 corresponding to the selected memory cells MC are provided by a certain number more than 1. If the result of the check indicates that all the selected memory cells MC are in the reset state, the process is not required to execute resetting again and therefore can finish (step s105). This decision can be performed by checking if the nodes DC in the sense amp control unit U101 of the sense amp 112 after pre-reading are all at "H" or not. On the other hand, if there is a memory cell MC in the set state, the process goes to step s106 to execute resetting.

Subsequently, at step s106, the process sets initial values of voltage and current required for resetting. For example, as for voltage, it sets a selected bit line voltage VBL_SEL and an unselected word line voltage VUX for initial reset pulse applying. As for current, in order to detect 2 levels at the sense amps 112, it sets the reference voltages VIREF_RSTWD and VIREF_SETWD that cause the reference currents IREF_RSTWD and IREF_SETWD to flow. The reference current IREF_SETWD at the time of first reset pulse applying is represented by IREF_SETWD0.

Figure 7:
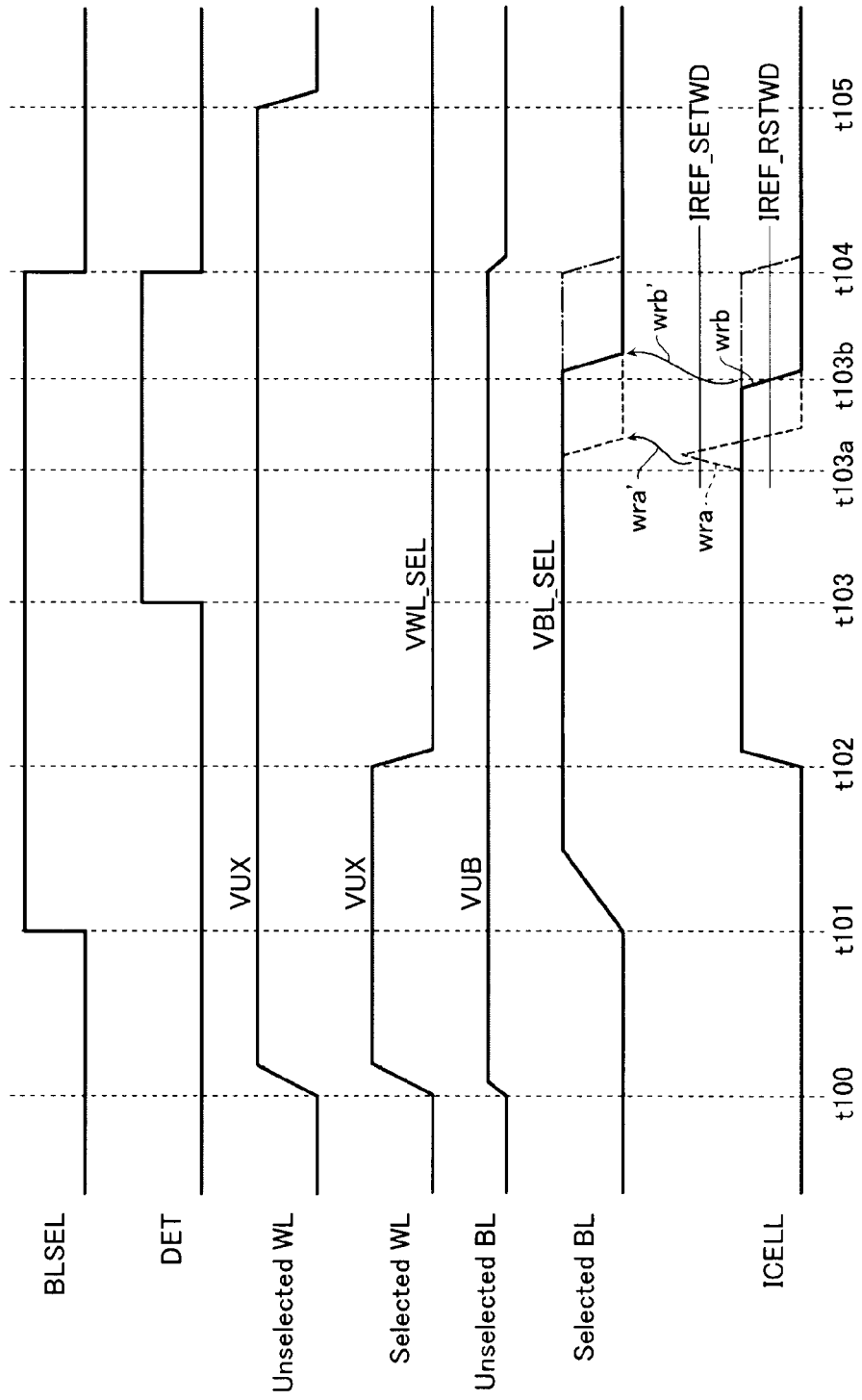
FIG. 7 is an operating waveform diagram at the time of resetting in the semiconductor memory device according to the present embodiment.

Subsequently, at step s107, reset pulse applying is executed to the selected memory cell MC. Operating waveforms at the time of reset pulse applying are shown in FIG. 7.

Initially, at timing t100, all word lines WL are supplied with the unselected word line voltage VUX. In addition, unselected bit lines BL are supplied with an unselected bit line voltage VUB.

Subsequently, at timing t101, the control signal BLSEL for bit line selection is turned to "H" to apply the bit line selection voltage VBL_SEL to the selected bit line BL from the sense amps 112. When the control signal BLSEL becomes "H", the control signal PULSE_ENB becomes "H" and the control signal BL_DIS becomes "L" if the node DC in the sense amp control unit U101 is at "L". As a result, the voltage on the node DSA and the bit line BL is controlled by the operational amplifier OP101 to be a voltage equal to the clamp voltage VCLAMP.

Subsequently, at timing t102, the voltage on the selected word line WL is dropped from the unselected word line voltage VUX to the selected word line voltage VWL_SEL. After this point in time, the potential difference, VEL_SEL− VWL_SEL, is applied across the selected memory cell MC. While the sense amp 112 exerts control such that the node DSA is held at the clamp voltage VCLAMP, it takes in the cell current ICELL flowing through the selected bit line BL.

In 2-level detecting, detection should be started from the state of the cell current ICELL taken in the sense amp 112 that locates between the reference current IREF_RSTWD and the reference current IREF_SETWD corresponding to 2 detection levels. Therefore, at the subsequent timing t103, the control signal DET is turned to "H". When the control signal DET becomes "H", the reset-ward detection circuit 112b and the set-ward detection circuit 112c are allowed to detect a variation in the cell current ICELL.

For example, at timing t103a, if the state of the selected memory cell MC makes an undesired set-ward transition, the cell current ICELL becomes larger than that in the reset state as shown in FIG. 7 with the waveform wra. If the cell current ICELL exceeds the reference current IREF_SETWD, the flag FLG_SETWD becomes "H". The flag FLG_SETWD is given to the sense amp control unit U101. As the control signal RST_MODE is at "H" on resetting, the flag FLG_OPP becomes "H". As a result, the control signal PULSE_ENB becomes "L" and the control signal BL_DIS becomes "H". Therefore, the transistor Q103 shown in FIG. 4 turns on to discharge the bit line BL and the node DSA as shown with the waveform wra' to finish the application of the reset pulse to the selected memory cell MC. In this case, the flag FLG_NML keeps "L" and accordingly the nodes DC, DCn in the sense amp control unit U101 are still unchanged and the reset pulse application is finished.

At the subsequent timing t103b, if the state of the memory cell MC normally makes a reset-ward transition, the cell current ICELL decreases and becomes smaller than the reference current IREF_RSTWD as shown in FIG. 7 with the waveform wrb, and turns the flag FLG_RSTWD to "H". In this case, the flag FLG_NML becomes "H" in the sense amp control unit U101 while the flag FLGOPP becomes "L". Accordingly, the node DCn changes from "H" to "L" while the node DC changes from "L" to "H". As a result, the control signal PULSE_ENB becomes "L" and the control signal BL_DIS becomes "H". Therefore, as shown with the waveform wrb', the charge on the node DSA and the bit line BL is discharged to finish the application of the reset pulse to the selected memory cell MC.

Subsequently, at timing t104, if the state of the memory cell MC makes no transition, the control signal BLSEL becomes "L". Therefore, the control signal PULSE_ENB becomes "L" and the control signal BL_DIS becomes "H" such that the charge on the node DSA and the selected bit line BL is discharged.

Finally, at timing t105, the charges on unselected word lines WL and unselected bit lines BL are discharged to finish the application of the reset pulse.

Through the above operations shown in FIG. 7, the application of the reset pulse at step s107 finishes.

Subsequently, at step s108, the process checks data in the latch LT151 in the sense amp control unit U101. If all nodes DC in the sense amp control unit U101 are at "H", it is possible to decide that resetting all selected memory cells MC is finished. Accordingly, in this case, the process ends resetting (step s109). On the other hand, no matter how the nodes DC in the sense amp control unit U101 are at "L" in part, the process goes to step s110.

Subsequently, at step s110, the process checks if the number of cycles of reset pulse applying reaches a certain maximum. If the number of cycles of reset pulse applying reaches the maximum, the process ends resetting as failed (step s111). On the other hand, unless the number of cycles of reset pulse applying reaches the maximum, the process goes to step s112.

Although not shown in the figure, if the number of cycles of reset pulse applying reaches the maximum, the process may count the number of reset-unfinished (failed) memory cells. In this case, if it is lower than a certain number, then the process may end resetting in the form of criterion-relieved pseudo-pass.

Subsequently, at step s112, the process increments the number of cycles of reset pulse applying.

Subsequently, at step s113, the process sets required voltage and current providing for the next reset pulse applying. In the next reset pulse applying, the selected bit line voltage VBL_SEL may be elevated by a certain value or the same condition may be used to retry such that the condition can be made somewhat easier than the present reset pulse applying. In the case of the selected memory cell MC that made a set-ward transition in the first reset pulse applying, the next reset pulse applying may finish with no stress exerted for resetting unless the reference current IREF_SETWD is elevated a little as can be considered.

Figure 8:
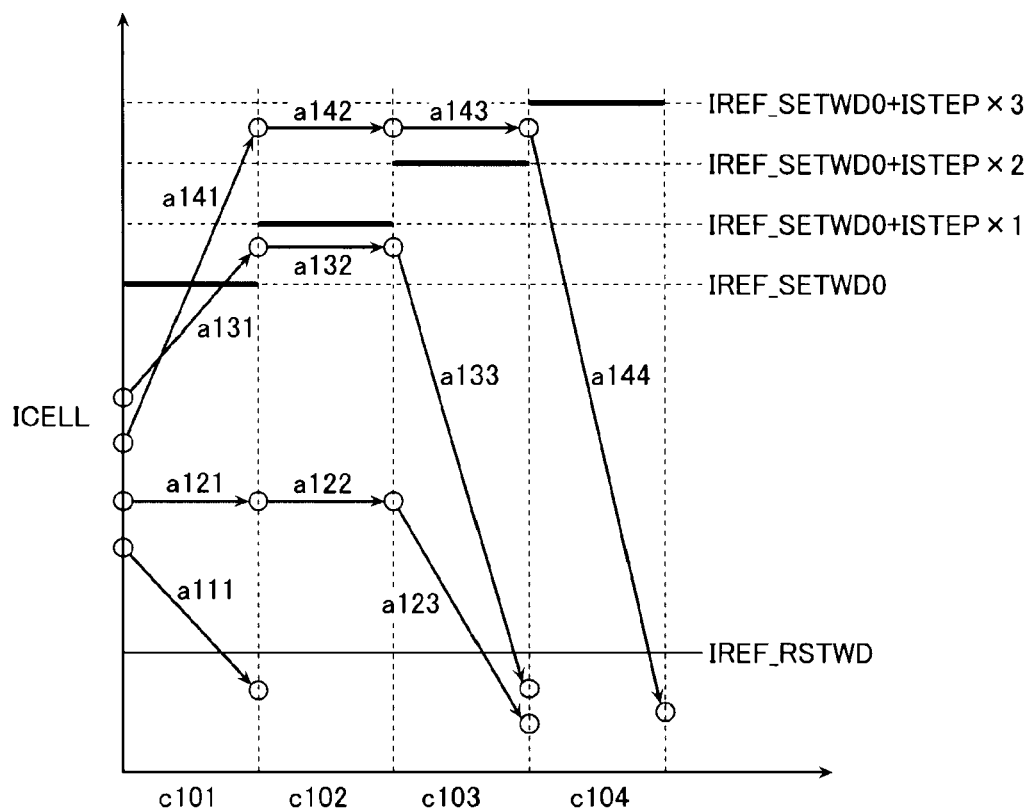
FIG. 8 is a diagram illustrative of the relation between reset pulse applying and reference currents in the semiconductor memory device according to the present embodiment.

FIG. 8 is a specific example showing the relation between the number of cycles of reset pulse applying and the reference current IREF_SETWD. This figure shows 4 patterns of variations in the cell current ICELL flowing in the memory cell MC at the time of resetting.

In the case of FIG. 8, the reference current IREF_SETWD is increased cycle by cycle at certain step widths ISTEP, such as IREF_SETWD0 in the first reset pulse applying cycle c101, IREF_SETWD0+ISTEP×1 in the second reset pulse applying cycle c102, IREF_SETWD0+ISTEP×2 in the third reset pulse applying cycle c103, and IREF_SETWD0+ ISTEP×3 in the fourth reset pulse applying cycle c104.

The first pattern indicates that the memory cell MC made a reset-ward transition in 1 reset pulse applying cycle as shown with the arrow a111.

The second pattern indicates that the state of the memory cell MC made no transition in 2 reset pulse applying cycles c101, c102 as shown with the arrows a121, a122 while the memory cell MC made a reset-ward transition in the third reset pulse applying cycle c103 as shown with the arrow a123.

The above 2 patterns have no problem because resetting is executed normally.

The third pattern indicates that the cell current ICELL rises in the first reset pulse applying cycle c101 as shown with the arrow a131 while the reference current IREF_SETWD0+ ISTEP exceeds the cell current ICELL shown with the arrow a132 in the second reset pulse applying cycle c102. In this case, reset pulses are applied to the selected memory cell MC in the reset pulse applying cycles c102, c103 so that it can make a reset-ward transition.

The fourth pattern indicates that the cell current ICELL greatly rises in the first reset pulse applying cycle c101 as shown with the arrow a141 and the cell current ICELL exceeds the reference current IREF_SETWD0+ISTEP in the second reset pulse applying cycle c102. In this case, a set-ward transition of the state of the selected memory cell MC is detected in the second reset pulse applying cycle c102. Therefore, the reset pulse applying is terminated soon as can be considered. In the later reset pulse applying cycles, however, the reference current IREF_SETWD can be increased. In the case of this figure, a reset pulse can be applied to the selected memory cell MC in the third reset pulse applying cycle c103. Thus, it is possible to provide an opportunity for making a normal reset-ward transition.

It should be noted herein that the reference current IREF_SETWD is originally a decision value used to prevent the state of the memory cell MC from making a large set-ward variation in order to avoid damage to the memory cell MC. Therefore, it is desirable to increase the reference current IREF_SETWD stepwise as shown in FIG. 8 within a range outside the hazard region that causes damage to the memory cell MC. Even if the range of increasing the reference current IREF_SETWD is limited as in this case, and only part of the selected memory cells MC made the set-ward state transition such that resetting is not finished, the resetting can be finished in the form of the pseudo-pass as described above. It can also be relieved by ECC. If there are such a number of fail bits that cannot be finished with the pseudo-pass, the selected word line WL can be treated as a failed word line.

As above, in accordance with the semiconductor memory device according to the present embodiment, even if the state of the memory cell makes a further reset-ward transition at the time of resetting, it is possible to detect such the abnormal operation. Therefore, it is possible to execute processing, for example, stop resetting the memory cell during abnormal operation and reduce damage to the memory cell.

In the sense amp 112 in the present embodiment, if the reset-ward detection circuit 112b is used as the abnormality detection circuit and the set-ward detection circuit 112c as the normality detection circuit, it is also possible in setting to execute detecting similar to the above-described resetting.

Second Embodiment

The first embodiment describes the semiconductor memory device that detects the normal cell current variation and the abnormal cell current variation at the time of resetting in accordance with the current comparison using 2 reference currents. In contrast, a second embodiment describes a semiconductor memory device that detects a variation in the potential on a sense node resulted from the comparison of a certain reference current with the cell current using 2 reference voltages.

The following description is given, concentrating on setting.

The entire configuration of the semiconductor memory device according to the present embodiment is similar to FIG. 2 except that it includes a sense amp 212 instead of the sense amp 112 shown in FIG. 2.

Figure 9:
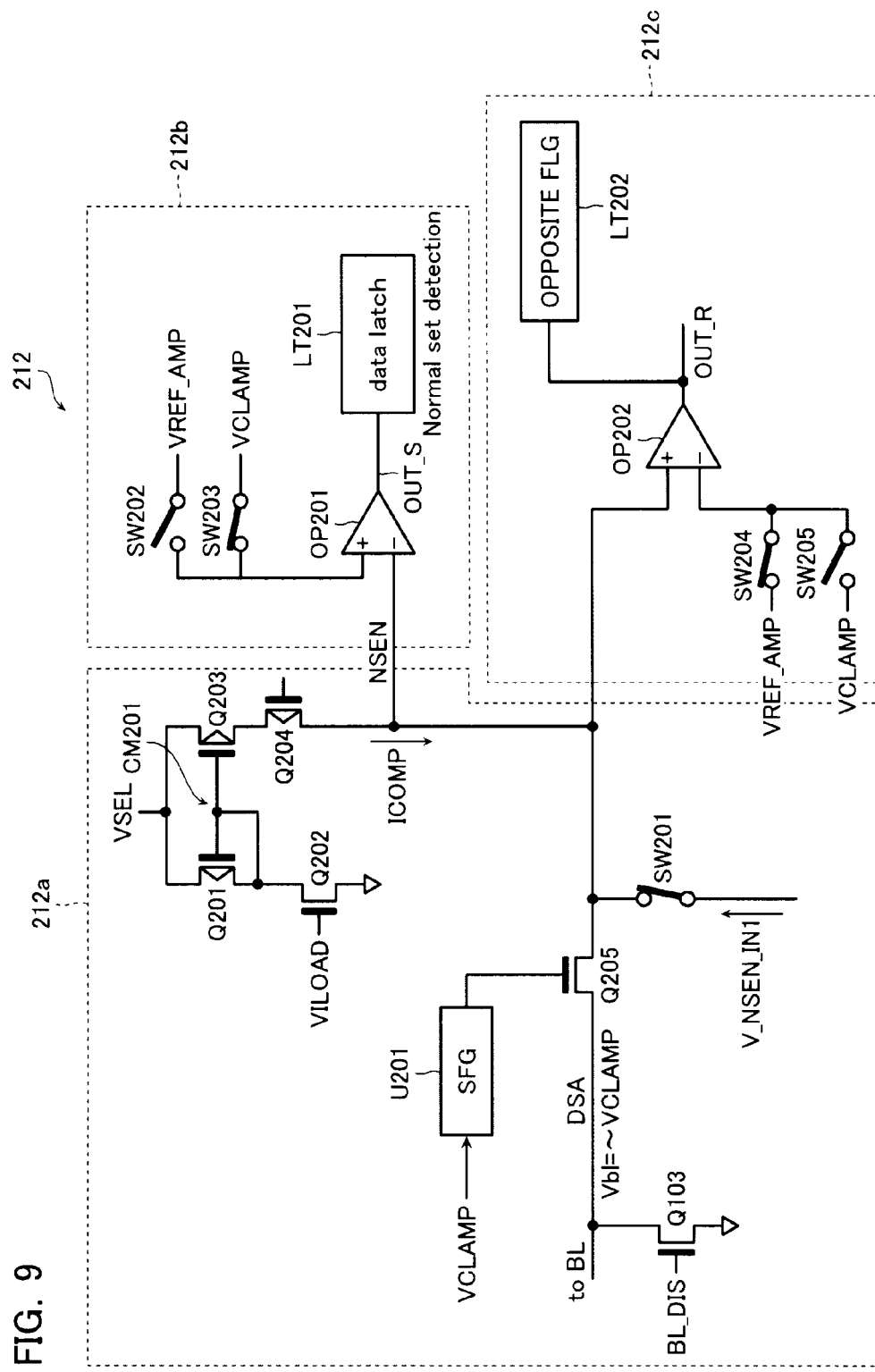
FIG. 9 is a circuit diagram of a part of a sense amp in a semiconductor memory device according to a second embodiment.

FIG. 9 is a circuit diagram showing a part of the sense amp 212.

The sense amp 112 includes a bit-line selection voltage supply circuit 212a. It also includes a set-ward detection circuit 212b (normality detection circuit) and a reset-ward detection circuit 212c (abnormality detection circuit).

The bit-line selection voltage supply circuit 212a is a circuit that supplies the bit line BL with a voltage VCLAMP required at the time of setting. Namely, the bit-line selection voltage supply circuit 212a includes a voltage clamping NMOS transistor Q205 between a sense node NSEN and a node DSA. The transistor Q205 is controlled in the form of a source follower so that the voltage on the bit line BL and the node DSA is made equal to the clamp voltage VCLAMP when a certain current flows.

The sense node NSEN is connected to a switch SW201. When the switch SW201 turns on, the sense node NSEN is pre-charged to an initial voltage V_NSEN_INI at the start time of setting from a certain voltage applying circuit.

The bit-line selection voltage supply circuit 212a also includes serially connected transistors Q201 and Q202 provided between a VSEL terminal and the ground line. Among those, the transistor Q202 is controlled by a control signal VILOAD to serve as a constant current circuit. The bit-line selection voltage supply circuit 212a further includes transistors Q203 and Q204 connected serially between the VSEL terminal and the sense node NSEN and in parallel with the constant current circuit. Among those, the transistor Q203 is used together with the transistor Q201 to configure a current mirror circuit CM201 having the input on the side close to the transistor Q201 and the output on the side close to the transistor Q203. Thus, a constant current, that is, a comparison current ICOMP can flow in the memory cell MC via the transistors Q203, Q204, the sense node NSEN and the node DSA linked to the bit line BL. When a constant comparison current ICOMP flows in the memory cell MC in this way, a voltage variation appears on the sense node NSEN in accordance with the state variation of the variable resistance VR in the memory cell MC.

The set-ward detection circuit 212b is a circuit that detects if the state of the memory cell MC makes a set-ward transition in setting.

The set-ward detection circuit 212b includes an operational amplifier OP201 as a voltage comparator circuit. The operational amplifier OP201 has a non-inverting input terminal, which is supplied with the clamp voltage VCLAMP via a switch SW203 at the time of setting. The clamp voltage VCLAMP is a voltage set on the selected bit line BL, which is a voltage lower than the initial voltage V_NSEN_INI, and which is a voltage that serves as a reference (first reference voltage) for detecting if the memory cell MC in the reset state makes a set-ward transition.

As described above, the potential on the bit line BL is controlled such that the potential on the bit line BL is made equal to the clamp voltage VCLAMP when the comparison current ICOMP flows in the bit line BL. Accordingly, when the selected memory cell MC is brought into a desired set state so that a current larger than the comparison current ICOMP can flow, the potential on the bit line BL and the sense node NSEN lowers below the clamp voltage VCLAMP.

The operational amplifier OP201 has an inverting input terminal, which is connected to the sense node NSEN. Thus, the clamp voltage VCLAMP can be compared with the voltage on the sense node NSEN at the time of setting. As a result, if the voltage on the sense node NSEN is made lower than the clamp voltage VCLAMP, that is, the state of the memory cell MC makes a set-ward transition, the output OUT_S from the operational amplifier OP201 becomes "H" to mean that setting was detected normally. This result is taken and held in a latch LT201 connected to the output terminal of the operational amplifier OP201. In addition, the charge on the node DSA and the bit line BL is discharged to VSS in accordance with the control signal BL_DIS given via the sense amp control unit U101.

On the other hand, the reset-ward detection circuit 212c is a circuit that detects if the state of the memory cell MC makes an originally undesired reset-ward transition in setting.

The reset-ward detection circuit 212c includes an operational amplifier OP202 as a voltage comparator circuit, of which inverting input terminal is supplied with VREF_AMP that is used as a second reference voltage. The reference voltage VREF_AMP is a voltage higher than the initial voltage V_NSEN_INI.

The operational amplifier OP202 has a non-inverting input terminal, which is connected to the sense node NSEN on the other hand. Thus, the operational amplifier OP202 can compare the reference voltage VREF_AMP with the voltage on the sense node NSEN at the time of setting. As a result of the comparison, if the voltage on the sense node NSEN is higher than the reference voltage VREF_AMP, the output OUT_R from the operational amplifier OP202 becomes "H". The output OUT_R from the operational amplifier OP202 leads to the output of the opposite direction detection signal FLG_RSTWD, "H", via a latch LT202, and the charge on the node DSA and the bit line BL is discharged to VSS in accordance with the control signal BL_DIS given from the sense amp control unit U101. In this case, data rewrite is not executed to the data latch LT201 that controls the set pulse application. Accordingly, if there is a next pulse application, it may be treated as a retry target.

Figure 10:
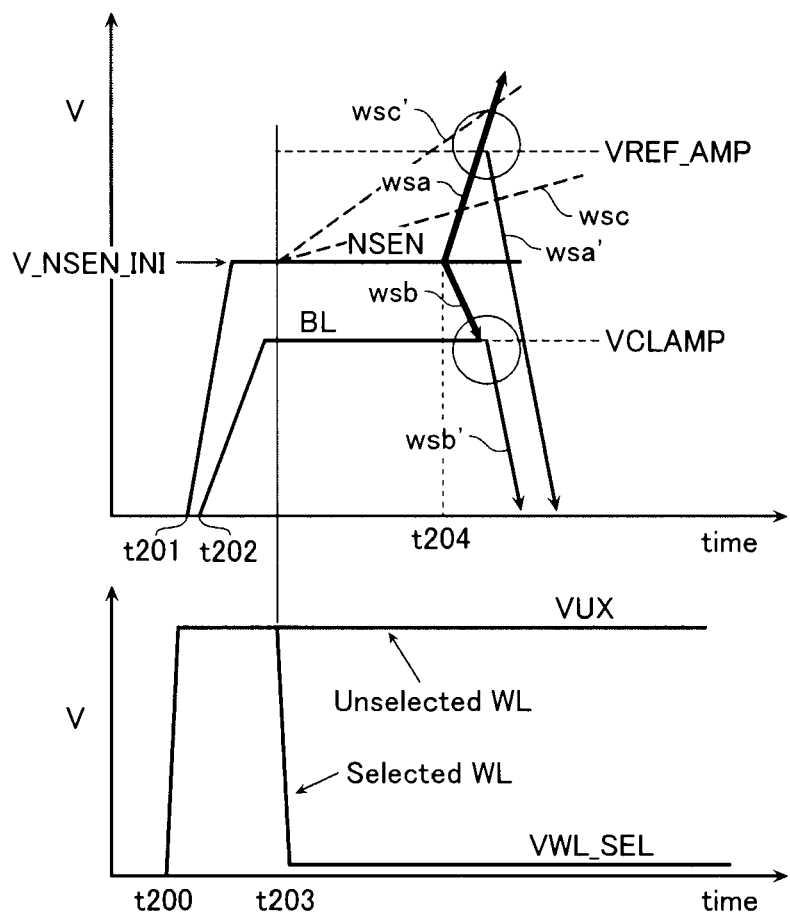
FIG. 10 is an operating waveform diagram at the time of setting in the semiconductor memory device according to the present embodiment.

Setting in the semiconductor memory device including the above-described sense amp 212 is described next with reference to FIG. 10.

Initially, at timing t200, all word lines WL are supplied with the unselected word line voltage VUX.

Subsequently, at timing t201, the switch SW201 is turned on to pre-charge the sense node NSEN with the initial voltage V_NSEN_INI. In addition, the bit line BL is charged to a voltage corresponding to the clamp voltage VCLAMP (at timing t202).

Subsequently, at timing t203, the voltage on the selected word line WL is dropped to the selected word line voltage VWLSEL. Thus, the selected memory cell MC starts setting.

Thereafter, at timing t204, for example, if the state of the selected memory cell MC makes a reset-ward transition, which "is not a desired state", the cell current ICELL becomes smaller than the initial state. Accordingly, the potential on the sense node NSEN rises faster as the waveform wsa. If the potential on the sense node NSEN exceeds the reference voltage VREF_AMP, the OPPOSIT FLG from the operational amplifier OP202 becomes "H". On receipt of this, the charge on the bit line BL and the sense node NSEN is discharged to halt the supply of the set pulse to the memory cell MC.

On the other hand, if the selected memory cell MC makes a normal set-ward transition, the output from the operational amplifier OP201 becomes "H" just when the voltage of the sense node NSEN lowers below the clamp voltage VCLAMP. In a word, it detects the normal set-ward transition of the state of the selected memory cell MC. In this case, after rewriting the data latch that controls the pulse application, the application of the set pulse is halted.

In this operating method, due to the magnitude relationship between the initial state of the selected memory cell and the comparison current ICOMP, a memory cell that makes no transition in the opposite direction but originally has a high resistance and a memory cell that makes a slow transition to the set state appear as a memory cell that makes a state transition in the opposite direction because the potential on the sense node NSEN reaches the reference voltage VREF_AMP sooner or later like the waveform wsc. As described earlier, however, when the opposite flag turns up, the data in the latch that controls pulse application is not rewritten. Accordingly, it will be a write target at the next retry pulse, causing no functional problem. The memory cell originally having a higher resistance than normal is detected with the opposite flag much faster as the waveform wsc'. Accordingly, it is possible to achieve the purpose of fast halting the set pulse application to memory cells that fall outside the desired range.

As above, in accordance with the semiconductor memory device according to the present embodiment, even if the state of the memory cell makes a further set-ward transition at the time of setting, it is possible to detect such the abnormal operation. Therefore, it is possible to execute processing, for example, stop setting the memory cell during abnormal operation and reduce damage to the memory cell.

At the time of resetting, the switches SW202, SW205 are turned on while the switches SW203, SW204 are turned off such that the set-ward detection circuit 212b compares the voltage on the sense node NSEN with the reference voltage VREF_AMP and the reset-ward detection circuit 212c compares the voltage on the node NSEN with the clamp voltage VCLAMP.

Namely, if it normally shifts to the reset state, the cell current ICELL is made smaller than the comparison current ICOMP to elevate the potential on the sense node NSEN. When it becomes higher than a certain level of VREF_AMP, a signal indicative of normal end is output to set the data latch LT201. In this case, the output OUT_S from the operational amplifier OP201 becomes "L" at the time of normal end though switching control may be added to correctly control the data latch 201.

On the other hand, if a low-resistance reset state makes an abnormal change to a much lower resistance state, the potential on the sense node NSEN lowers and accordingly the output OUT_R from the operational amplifier OP202 becomes "L". Also in this case, appropriate switching control may be added to output the opposite flag.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array including a first line, a second line crossing said first line, and a memory cell containing a variable resistance element provided on an intersection of said first and second lines;
   a data write unit operative to cause said variable resistance element to make a transition from a first resistance to a second resistance different from said first resistance; and
   a resistance state detection unit including an abnormality detection circuit operative to detect a transition of the resistance of said variable resistance element to a third resistance when said data write unit causes said variable resistance element to make the transition from said first resistance to said second resistance (where the third resistance<the first resistance<the second resistance, or the third resistance>the first resistance>the second resistance).

2. The semiconductor memory device according to claim 1, wherein said abnormality detection circuit includes
a reference current circuit operative to cause a first reference current, and
a current comparator circuit operative to compare said first reference current with a cell current flowing in said memory cell.

3. The semiconductor memory device according to claim 1, wherein said data write unit repeatedly supplies voltage pulses to said memory cell via said first and second lines to cause said variable resistance element to make the transition from said first resistance to said second resistance,
wherein said abnormality detection circuit stops the supply of said voltage pulses from said data write unit when it detects the transition of said memory cell to said third resistance.

4. The semiconductor memory device according to claim 1, wherein said data write unit repeatedly supplies voltage pulses to said memory cell via said first and second lines to cause said variable resistance element to make the transition from said first resistance to said second resistance,
wherein said reference current circuit in said abnormality detection circuit varies said first reference current at certain step widths in accordance with an increase of the number of repetitions of said voltage pulses.

5. The semiconductor memory device according to claim 1, wherein said data write unit includes a discharging transistor operative to discharge charge on said second line and repeatedly supplies voltage pulses to said memory cell via said first and second lines to cause said variable resistance element to make the transition from said first resistance to said second resistance,
wherein said abnormality detection circuit turns on said discharging transistor when it detects the transition of said memory cell to said third resistance.

6. The semiconductor memory device according to claim 2, wherein said abnormality detection circuit includes a current mirror circuit of which an input side is serially connected to said reference current circuit and an output side serially connected to a circuit operative to cause said cell current to flow therethrough.

7. A semiconductor memory device, comprising:
a memory cell array including a first line, a second line crossing said first line, and a memory cell containing a variable resistance element provided on an intersection of said first and second lines;
a data write unit operative to cause said variable resistance element to make a transition from a first resistance to a second resistance different from said first resistance; and
a resistance state detection unit operative to detect a transition of the resistance of said variable resistance element,
wherein said resistance state detection unit includes
a normality detection circuit operative to detect a transition of the resistance of said variable resistance element to said second resistance when said data write unit causes said variable resistance element to make the transition from said first resistance to said second resistance, and
an abnormality detection circuit operative to detect a transition of the resistance of said variable resistance element to a third resistance when said data write unit causes said variable resistance element to make the transition from said first resistance to said second resistance (where the third resistance<the first resistance<the second resistance, or the third resistance>the first resistance>the second resistance).

8. The semiconductor memory device according to claim 7, wherein said normality detection circuit includes
a reference current circuit operative to cause a second reference current, and
a current comparator circuit operative to compare said second reference current with a cell current flowing in said memory cell.

9. The semiconductor memory device according to claim 7, wherein said data write unit repeatedly supplies voltage pulses to said memory cell via said first and second lines to cause said variable resistance element to make the transition from said first resistance to said second resistance,
wherein said normality detection circuit stops the supply of said voltage pulses from said data write unit when it detects the transition of said memory cell to said second resistance.

10. The semiconductor memory device according to claim 8, wherein said data write unit repeatedly supplies voltage pulses to said memory cell via said first and second lines to cause said variable resistance element to make the transition from said first resistance to said second resistance,
wherein said reference current circuit in said normality detection circuit causes said second reference current to flow while voltage pulses are repeatedly supplied to said memory cell.

11. The semiconductor memory device according to claim 7, wherein said data write unit includes a discharging transistor operative to discharge charge on said second line and repeatedly supplies voltage pulses to said memory cell via said first and second lines to cause said variable resistance element to make the transition from said first resistance to said second resistance,
wherein said normality detection circuit turns on said discharging transistor when it detects the transition of said memory cell to said second resistance.

12. The semiconductor memory device according to claim 8, wherein said normality detection circuit includes a current mirror circuit of which an input side is serially connected to said second reference current circuit and an output side serially connected to a circuit operative to cause said cell current to flow therethrough.

13. A semiconductor memory device, comprising:
a memory cell array including a first line, a second line crossing said first line, and a memory cell containing a variable resistance element provided on an intersection of said first and second lines;
a data write unit operative to cause said variable resistance element to make a transition from a first resistance to a second resistance different from said first resistance; and
a resistance state detection unit operative to detect a transition of the resistance of said variable resistance element,
wherein said resistance state detection unit includes
a normality detection circuit operative to compare a voltage caused on a sense node in accordance with a difference between a certain reference current and a current flowing in said memory cell with a certain first reference voltage to detect a transition of said variable resistance element from said first resistance to said second resistance, and
an abnormality detection circuit operative to compare said voltage caused on said sense node with a certain second reference voltage to detect a transition of the resistance of said variable resistance element to a third resistance (where the third resistance<the first resistance<the second resistance, or the third resistance>the first resistance>the second resistance).

14. The semiconductor memory device according to claim 13, wherein said normality detection circuit includes a voltage comparator circuit operative to detect when the voltage on said sense node is lower than said first reference voltage.

15. The semiconductor memory device according to claim 14, wherein said voltage comparator circuit in said normality detection circuit further detects when the voltage on said sense node is lower than said second reference voltage.

16. The semiconductor memory device according to claim 13, wherein said abnormality detection circuit includes a voltage comparator circuit operative to detect when the voltage on said sense node is lower than said second reference voltage.

17. The semiconductor memory device according to claim 16, wherein said voltage comparator circuit in said abnormality detection circuit further detects when the voltage on said sense node is higher than said first reference voltage.

18. The semiconductor memory device according to claim 13, wherein said data write unit includes a clamping transistor controlled by said first reference voltage and operative to clamp a voltage on said second line.

* * * * *